(12) United States Patent
Yoon et al.

(10) Patent No.: US 8,331,152 B2
(45) Date of Patent: Dec. 11, 2012

(54) NONVOLATILE MEMORY DEVICE

(75) Inventors: HongSik Yoon, Seongnam-si (KR); Jinshi Zhao, Seoul (KR); Ingyu Baek, Seoul (KR); Hyunjun Sim, Hwaseong-si (KR); Minyoung Park, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 402 days.

(21) Appl. No.: 12/765,411

(22) Filed: Apr. 22, 2010

(65) Prior Publication Data

US 2010/0271862 A1   Oct. 28, 2010

(30) Foreign Application Priority Data

Apr. 23, 2009  (KR) .................. 10-2009-0035610

(51) Int. Cl.
*G11C 11/34* (2006.01)
(52) U.S. Cl. .......... 365/185.11; 365/185.13; 365/230.03
(58) Field of Classification Search .................. None
See application file for complete search history.

(56) References Cited

U.S. PATENT DOCUMENTS

| | | | | |
|---|---|---|---|---|
| 5,748,545 A | * | 5/1998 | Lee et al. | 365/201 |
| 5,838,604 A | * | 11/1998 | Tsuboi et al. | 365/63 |
| 7,112,815 B2 | * | 9/2006 | Prall | 257/2 |
| 7,570,511 B2 | * | 8/2009 | Cho et al. | 365/163 |
| 2003/0185048 A1 | | 10/2003 | Fricke et al. | |
| 2004/0245544 A1 | | 12/2004 | Fricke et al. | |
| 2005/0230724 A1 | | 10/2005 | Hsu | |
| 2008/0112209 A1 | | 5/2008 | Cho et al. | |

FOREIGN PATENT DOCUMENTS

| | | |
|---|---|---|
| JP | 2005-311322 | 11/2005 |
| JP | 2007-149170 | 6/2007 |
| KR | 100827697 | 4/2008 |

* cited by examiner

*Primary Examiner* — Alexander Sofocleous
(74) *Attorney, Agent, or Firm* — F. Chau & Associates, LLC

(57) ABSTRACT

A nonvolatile memory device includes resistive memory devices in a three-dimensional structure. A block select circuit generates a block select signal for selecting a memory block. In response to the block select signal, local word line selection units connected to each memory block connect global word lines connected to a word line decoder and local word lines, and local bit line selection units connected to each memory block connect global bit lines connected to a sense amplifier and local bit lines. Each memory block includes local word lines which extend in a first direction and are stacked in a second direction perpendicular to the first direction on a second plane perpendicular to a first plane. Local bit lines extend in the second direction to cross local word lines. Memory cells are formed at cross-points where local word lines and local bit lines cross one another.

17 Claims, 14 Drawing Sheets

NONVOLATILE MEMORY DEVICE

CROSS-REFERENCE TO RELATED APPLICATION

This patent application claims under 35 U.S.C. §119 priority to and the benefit of Korean Patent Application No. 10-2009-0035610, filed on Apr. 23, 2009, the entire content of which is incorporated by reference herein.

BACKGROUND

1. Technical Field

The present disclosure relates to memory devices, and more particularly, to nonvolatile memory devices that drive three dimensionally arranged resistance memory devices.

2. Discussion of Related Art

Generally, semiconductor memory devices may be classified into volatile memory devices and nonvolatile memory devices. Volatile memory devices lose their stored data when their power supplies are interrupted. Volatile memory devices may include, for example, a dynamic random access memory (DRAM) and a static random access memory (SRAM). Nonvolatile memory devices retain their stored data even when their power supplies are interrupted. Nonvolatile memory devices may include, for example, a programmable ROM (PROM), an erasable PROM (EPROM), an electrically EPROM (EEPROM) and a flash memory device.

Recently, pursuant to emerging trends toward high performance and low power semiconductor memory devices, next generation semiconductor memory devices such as ferroelectric random access memory (FRAM), magnetic random access memory (MRAM), phase change random access memory (PRAM) and resistive random access memory (RRAM) are being developed. Materials constituting the next generation semiconductor memory devices have different resistances according to current or voltage, and maintain their resistance even when a power supply is interrupted.

Nonvolatile memory devices having resistive memory cells arranged in a three-dimensional structure are being developed to improve integration.

SUMMARY

Exemplary embodiments of the inventive concept provide a nonvolatile memory device.

According to an exemplary embodiment, a nonvolatile memory device includes a plurality of memory blocks. A block selection circuit generates a block select signal for selecting at least one of the memory blocks. A plurality of local word line selection units connect global word lines connected to a word line decoder and local word lines in response to the block select signal, the plurality of local word line selection units being connected to each memory block. A plurality of local bit line selection units connect global bit lines connected to a sense amplifier and local bit lines in response to the block select signal, the plurality of local bit line selection units being connected to each memory block. Each memory block includes the local word lines which extend in a first direction on a second plane perpendicular to a first plane and are stacked in a second direction perpendicular to the first direction, the local bit lines which extend in the second direction to cross the local word lines, and memory cells formed at cross-points where the local word lines and the local bit lines cross one another.

The global word lines may be connected to the local word line selection unit in common.

The global bit lines may be connected to the local bit line selection unit in common.

The local word line selection unit may include a plurality of word line select transistors controlled by the block select signal, and a bias transistor that provides a bias signal that controls the bit line selection unit to the bit line selection unit in response to the block select signal.

The local bit line selection unit may include a plurality of bit line select transistors controlled by the bias signal.

The nonvolatile memory device may further include a plurality of memory banks having the plurality of memory blocks, the local word line selection units and the local bit line selection units, and a bank select circuit that generates a memory bank select signal that selects at least one of the memory banks.

The nonvolatile memory device may further include a block select switching circuit connected to each of the memory banks and that transfers the block select signal to a selected memory bank in response to the memory bank select signal.

The block select switching circuit may include a plurality of block select transistors that connects the block select circuit and the local word line selection units in response to the memory bank select signal.

The memory cell may include at least one of a resistive memory device, or a resistive memory device and a switching device.

The memory cell may include a phase change material, a transition metal oxide or a magnetic material.

According to an exemplary embodiment a resistive random access memory array apparatus includes a plurality of memory blocks stacked in a first direction, each memory block having an array of memory cells located in a plane of the memory block, the plane being substantially perpendicular to the first direction, each memory cell being a resistive memory cell located at an intersection of a local word line and a local bit line in the plane. A local word line selection unit is configured to connect the local word line of the memory block to a global word line. A local bit line selection unit is configured to connect the local bit line of the memory block to a global bit line. A block select circuit generates a block select signal for selecting a memory block. In response to the block select signal, a selected local word line selection unit connects a selected memory cell to a global word line and a selected local bit line selection unit connects the selected memory cell to a global bit line.

The resistive memory cell may include a resistive memory material layer disposed between the local word line and the local bit line.

The resistive memory material layer may be from the group consisting of a colossal magnetro-resistive (CRM) material layer having a perovskite structure, a high temperature super conducting (HTSC) material layer, and or a transition metal oxide layer having two stable resistive states.

A first plurality of the memory blocks may be in a first memory bank and a second plurality of memory blocks are in a second bank. A bank select circuit may generate a memory bank select signal that selects at least one of the first memory bank or the second memory bank.

The array of memory cells may be accessible to a memory controller of a memory card, the memory controller controlling data exchange between a host and the array of memory cells.

The array of memory cells may be accessible to a memory controller coupled to a bus of a data processing system having a central processing unit that stores processed data in the array of memory cells.

The array of memory cells may be accessible to a memory controller coupled to a bus of a memory system, the memory controller configured to execute commands stored in the array of memory cells.

BRIEF DESCRIPTION OF THE DRAWINGS

The accompanying drawings illustrate exemplary embodiments of the inventive concept and, together with the detailed description, serve to explain principles of the inventive concept.

DETAILED DESCRIPTION OF THE EMBODIMENTS

Exemplary embodiments of the inventive concept will be described below in more detail with reference to the accompanying drawings. Like numbers refer to like elements throughout.

It will also be understood that when an element such as a layer, region or substrate is referred to as being "on" or "onto" another element, it may lie directly on the other element or intervening elements or layers may also be present.

Figure 1:
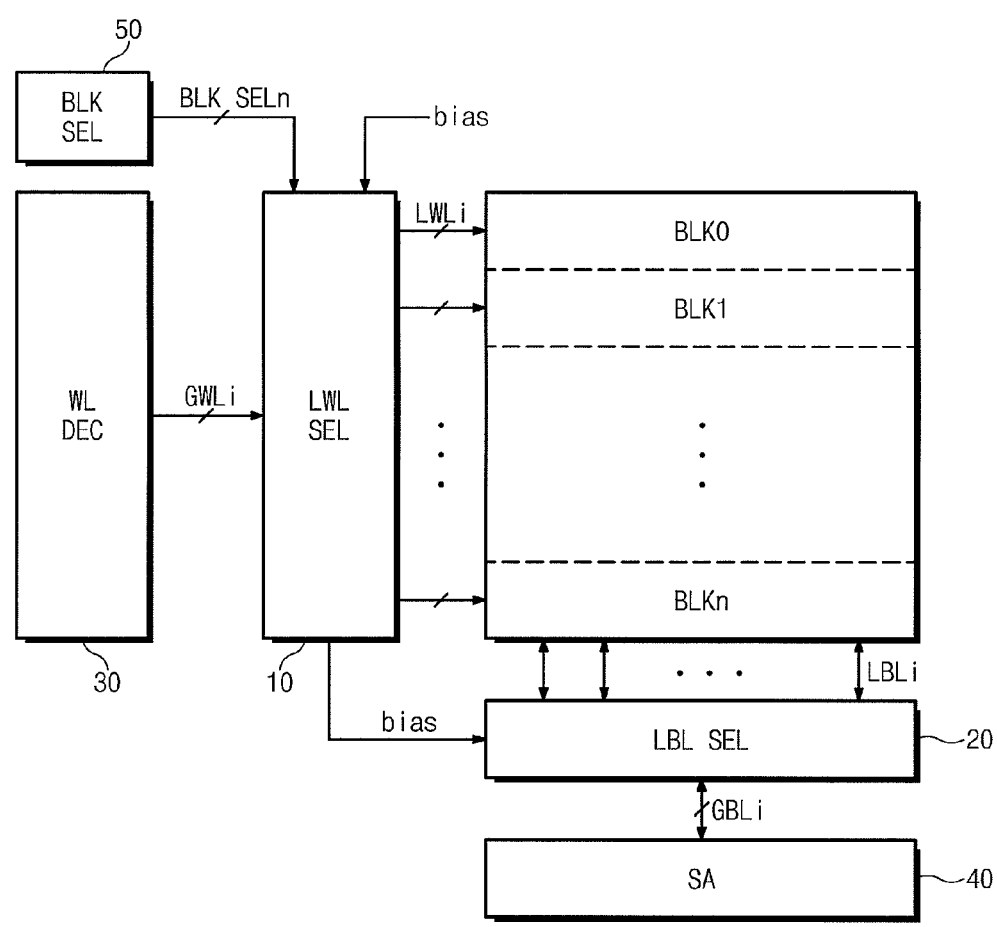
FIG. 1 is a block diagram of a nonvolatile memory device in accordance with an exemplary embodiment of the present inventive concept.
Figure 2:
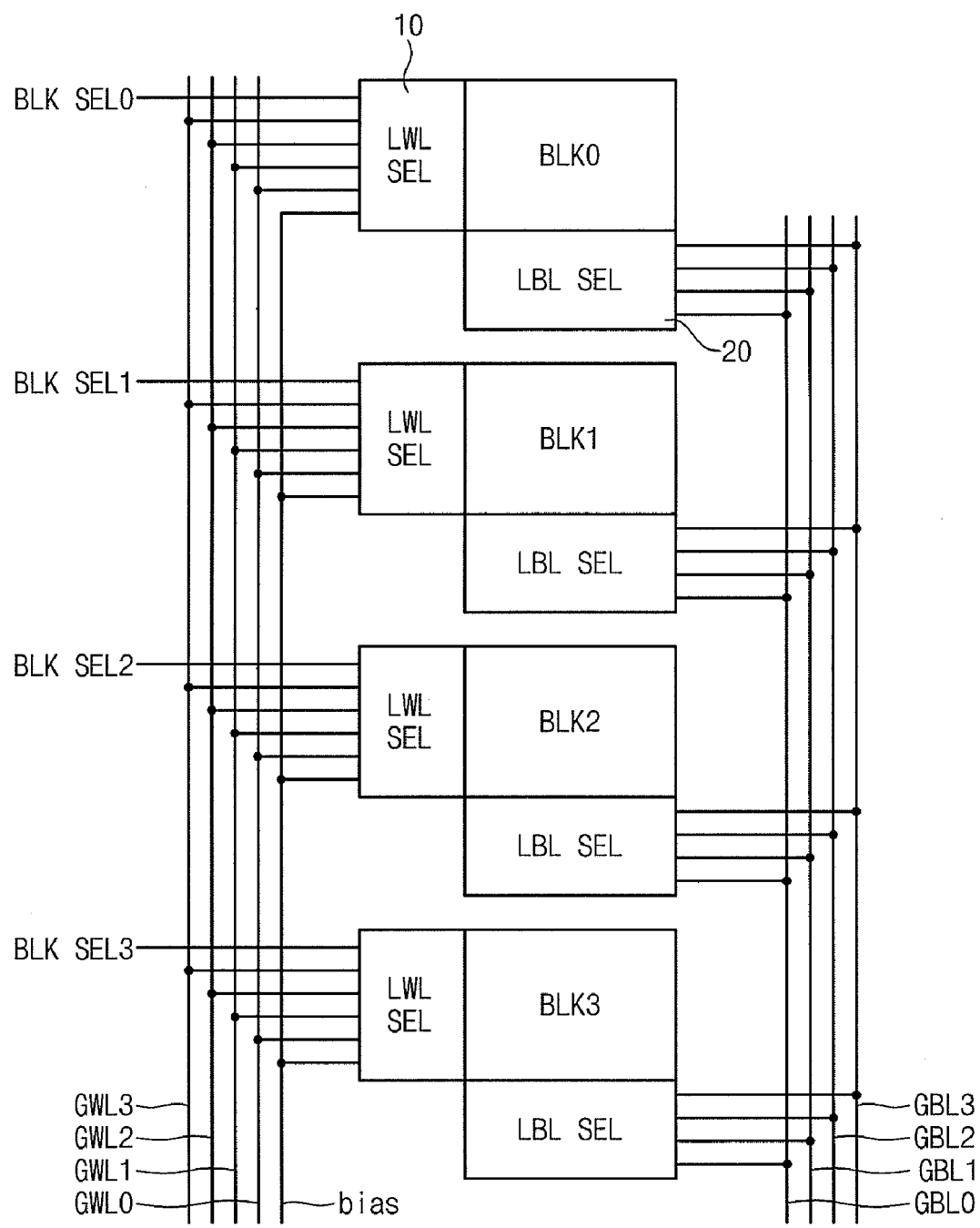
FIG. 2 is a schematic diagram illustrating a connection between memory blocks in a nonvolatile memory device in accordance with an exemplary embodiment of the present inventive concept.

FIG. 1 is a block diagram of a nonvolatile memory device in accordance with an exemplary embodiment of the present inventive concept. FIG. 2 is a view illustrating a connection between memory blocks in a nonvolatile memory device in accordance with an exemplary embodiment of the present inventive concept.

Referring to FIGS. 1 and 2, a nonvolatile memory device includes a plurality of memory blocks BLK0, . . . BLKn, a local word line selection unit 10, a local bit line selection unit 20, a word line decoder 30, a sense amplifier 40 and a block select circuit 50. The nonvolatile memory device in accordance with an exemplary embodiment of the present inventive concept includes memory cells three dimensionally arranged over the plurality of memory blocks BLK0, . . . BLKn.

More specifically, each of the memory blocks BLK0, . . . BLKn includes a plurality of word lines, bit lines and memory cells. In particular, the plurality of word lines may include a hierarchical word line structure using a plurality of global word lines GWLi and a plurality of local word lines LWLi. Also, the plurality of bit lines may include a hierarchical bit line structure using a plurality of global bit lines GBLi and a plurality of local bit lines LBLi. The memory cells may be connected to cross-points of the local word line LWLi and the local bit line LBLi. The memory cells include a resistive memory cell which can switch between two resistive states by an applied electric pulse. For example, a resistive memory cell can include phase change materials, transition metal oxide or magnetic materials.

Also, each memory block BLK0, . . . BLKn is connected to the local word line selection unit 10 and the local bit line selection unit 20. The local word line selection units 10 included in each of the memory blocks share the word line decoder 30 and the local bit line selection units 20 included in each of the memory blocks share the sense amplifier 40.

The local word line selection unit 10 connects local word lines of the selected memory block BLKn to the global word line GWLi provided from the word line decoder 30 according to a block select signal. The local word line selection unit 10 can transmit a bias signal to the local bit line selection unit 20 for driving the local bit line selection unit 20 of the selected memory block BLKn.

The local bit line selection unit 20 receives the bias signal to connect local bit lines LBLi of the selected memory block BLK to global bit line GBLi provided from the sense amplifier 40.

The word line decoder 30 decodes an address received from the outside to select the global word line GBLi. The global word lines GWLi include the same number as the number of the local word lines LWLi included in one memory block BLKn. The word line decoder 30 is connected to the plurality of memory blocks BLK0, . . . BLKn in common and provides data to the local word lines LWLi connected to the selected memory block BLKn according to a block selected signal BLK SELn of the block select circuit 50. Thus, the local word lines LWLi of each of the memory blocks BLK0, . . . BLKn may be selected by the same address signal.

The sense amplifier 40 senses data stored in the memory cells when a read operation is performed and may temporally store data to be stored in the memory cells according to an operational mode. The sense amplifier 40 may be commonly connected to the plurality of memory blocks BLK0, . . . BLKn and may sense data stored in the memory cells of the selected memory block BLKn by the block select signal BLK SELn of the block select circuit 50.

Also, the sense amplifier 40 may be connected to a bit line decoder (not illustrated). The bit line decoder selects the global bit line GBLi connected to the selected memory cell according to address signal and may provide a data transferring path between the sense amplifier 40 and the outside (e.g., a memory controller).

The block select circuit 50 generates a block select signal BLK SELn for selecting one memory block among the plurality of memory blocks BLK0, . . . BLKn according to address signal. The block select signal BLK SELn is provided to the local word line selection unit 10 corresponding to each of the memory blocks BLK0, . . . BLKn. The local word lines LWLi and the local bit lines LBLi of the memory block BLKn selected by the block select signal BLK SELn are connected to the corresponding global word lines GWLi and the corresponding global bit lines GBLi.

Figure 3:
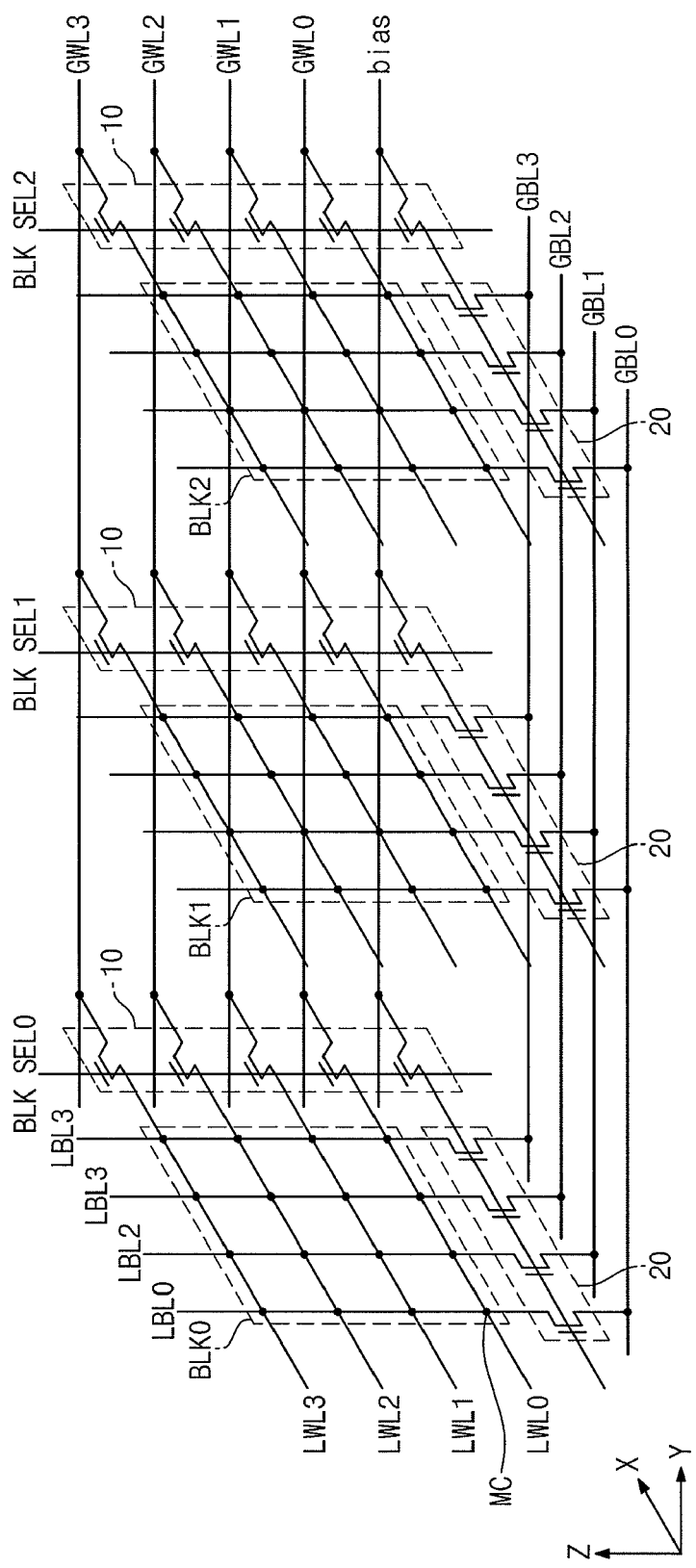
FIG. 3 is a circuit diagram of a nonvolatile memory device in accordance with an exemplary embodiment of the present inventive concept.
Figure 4:
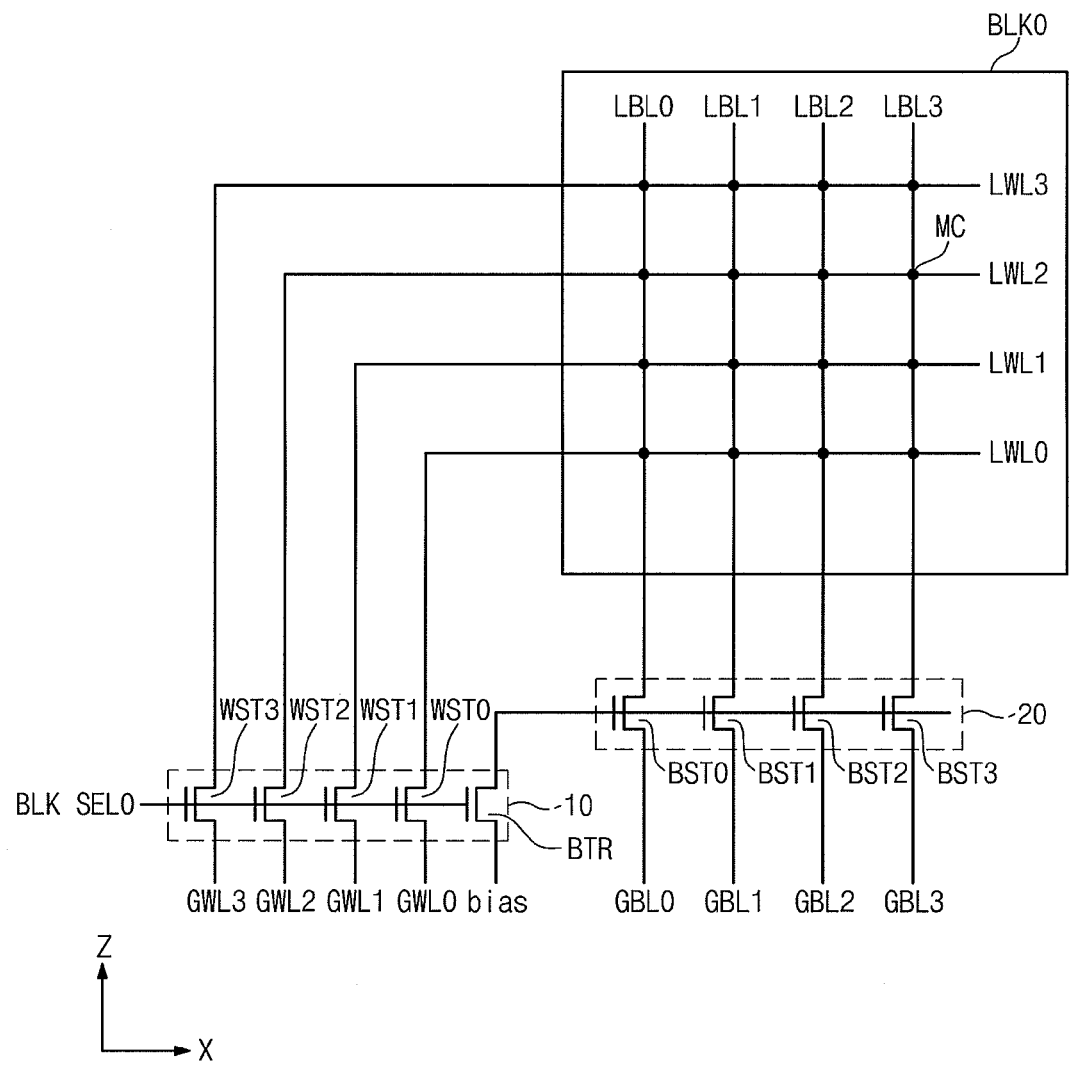
FIG. 4 is a circuit diagram of a memory block in a nonvolatile memory device in accordance with an exemplary embodiment of the present inventive concept.

FIGS. 3 and 4 are circuit diagrams of a nonvolatile memory device in accordance with an exemplary embodiment of the present inventive concept. FIG. 4 illustrates the local word line selection unit 10 and the local bit line selection unit 20 for a representative memory block BLK0.

A nonvolatile memory device in accordance with an exemplary embodiment of the present inventive concept assumes that each memory block has four local word lines and four local bit lines. However, the present inventive concept is not limited to the four local word lines and four local bit lines, and the number of the memory blocks, the local word lines and the local bit lines may be different according to the desired memory capacity of the nonvolatile memory device.

Referring to FIGS. 3 and 4, memory cells MC are three dimensionally arranged over a plurality of memory blocks BLK0, . . . BLK2.

More specifically, one memory block BLK0 includes memory cells MC arranged on a second plane perpendicular to a first plane. The second plane includes a plurality of local word lines LWL0, . . . LWL3 extending in a first (x) direction and a plurality of local bit lines LBL0, . . . LBL3 extending in a second (z) direction perpendicular to the first direction. On the second plane, the memory cells MC are connected to cross-points at which the local word lines LWL0, . . . LWL3 and the local bit lines LBL0, . . . LBL3 cross one another. In an exemplary embodiment of the present inventive concept, the first plane is an xy plane formed by an x axis and a y axis and the second plane is an xz plane formed by an x axis and a z axis which is perpendicular to the x axis and the y axis. The plurality of memory blocks BLK0, . . . BLK2 is arranged to be the plural number in a third (y) direction perpendicular to the first (x) direction and the second (z) direction. That is, in each of the memory blocks BLK0, . . . BLK2, the memory cells MC are two dimensionally arranged and the plurality of memory blocks BLK0, . . . BLK2 is arranged in the y axis direction and thereby the memory cells MC have a structure that is three dimensionally arranged.

Each memory cell MC may be formed of one resistive memory device or may be formed of one resistive memory device and one switching device. A resistive memory device forming the memory cell MC may be formed of a transition metal oxide of which a resistance becomes different according to an applied voltage. A switching device may be a transistor or a diode. In the exemplary embodiments of the present inventive concept, it is assumed that the memory cell MC comprises one resistive memory device. That is, an arrangement of memory cells MC in accordance with an exemplary embodiment of the present inventive concept may be a cross-point memory array which does not require a selective transistor for accessing each resistive memory device. Accordingly, in each of the memory blocks BLK0, . . . BLK2, resistive memory devices are connected to cross-points at which the local word lines LWL0, . . . LWL3 extending in the x axis direction and the local bit lines LBL0, . . . LBL3 extending in the z axis direction cross one another.

In each of the memory blocks BLK0, . . . BLK2, the local word lines LWL0, . . . LWL3 are connected to the corresponding global word lines GWL0, . . . GWL3 by a local word line selection unit 10. The local word line selection unit 10 includes a plurality of word line select transistors WST0, . . . WST3 and a bias transistor BTR. The word line select transistors WST0, . . . WST3 are serially connected between the local word lines LWL0, . . . LWL3 and the global word lines GWL0, . . . GWL3. The bias transistor BTR transmits a bias signal for activating the local bit line selection unit 20. The word line select transistors WST0, . . . WST3 and the bias transistor BTR are controlled by block select signals BLK SEL0, . . . BLK SEL2 outputted from the block select circuit 50.

Also, in each of the memory blocks BLK0, . . . BLK2, the local bit lines LBL0, . . . LBL3 are connected to the global bit lines GBL0, . . . GBL3 by the local bit line selection unit 20. The local bit line selection unit 20 includes the bit line select transistors BST0, . . . BST3 serially connected between the global bit lines GBL0, . . . GBL3 corresponding to the local bit lines LBL0, . . . LBL3. The bit line select transistors BST0, . . . BST3 may be turned on by a bias signal. When the bias transistor BTR is turned on by the block select signal BLK SEL0, . . . BLK SEL2, the bias signal is provided to the local bit line selection unit 20.

That is, in the nonvolatile memory device in accordance with an exemplary embodiment of the present inventive concept, in memory blocks BLK0, . . . BLK2 different from one another, the memory cells MC corresponding to the same address have a structure commonly connected to the same global word line and the same global bit line. In other words, the local word lines LWL0, . . . LWL3 and the local bit lines LBL0, . . . LBL3 of the memory block selected by the block select signal BLK SEL0, . . . BLK SEL2 are connected to respectively corresponding global word lines GWL0, . . . GWL3 and the global bit lines GBL0, . . . GBL3.

Thus, the nonvolatile memory device in accordance with an exemplary embodiment of the present inventive concept decodes the global word lines GWL0, . . . GWL3 and the global bit lines GBL0, . . . GBL3, thereby selecting one memory cell among the three dimensionally arranged memory cells.

More specifically, the local word lines LWL0, . . . LWL3 of the memory block BLK0 selected by the block select signal BLK SEL0 provided from the block select circuit 50 in FIG. 1 are connected to the corresponding global word lines GWL0, . . . GWL3 and the local word lines LWL0, . . . LWL3 of the memory block BLK1, BLK2 unselected by the block select signal BLK SEL0 are floated. At least one of the local word lines LWL0, . . . LWL3 of the selected memory block BLK0 may be selected according to address signal. Also, the local bit line selection unit 20 of the memory block BLK0 selected by the block select signal BLK SEL0 is activated and thereby the local bit lines LBL0, . . . LBL3 of the selected memory block BLK0 are connected to corresponding global bit lines GBL0, . . . GBL3. The local word lines LWL0, . . . LWL3 and the local bit lines LBL0, . . . LBL3 of unselected memory block BLK1, BLK2 are floated. Accordingly, a read operation and a write operation with respect to the selected memory block BLK0 may be performed.

Figure 5:
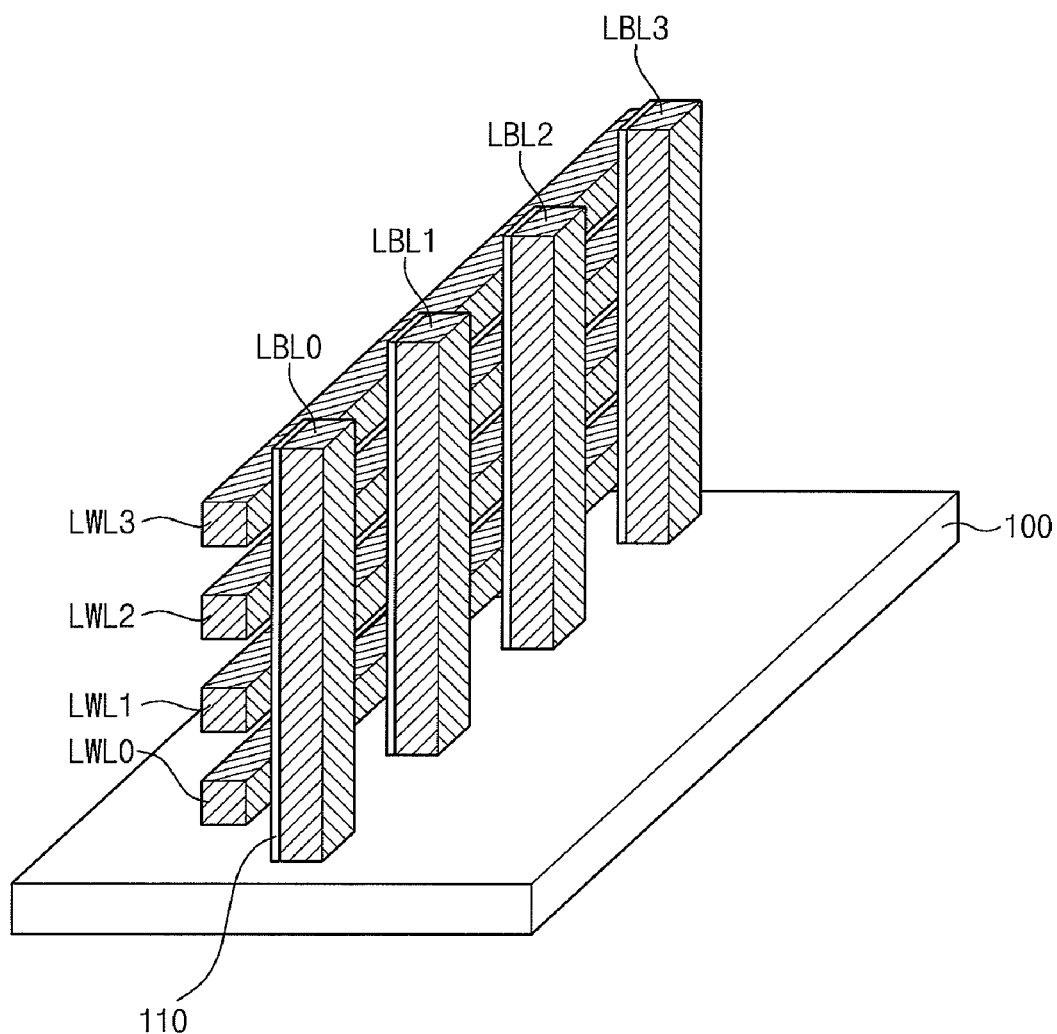
FIG. 5 is a perspective view illustrating a memory block in a nonvolatile memory device in accordance with an exemplary embodiment of the present inventive concept.

FIG. 5 is a perspective view illustrating a memory block included in one memory block illustrated in a nonvolatile memory device in accordance with an exemplary embodiment of the present inventive concept.

Referring to FIG. 5, the local word lines LWL0, . . . LWL3 included in each of the memory blocks BLK0, . . . BLK2 may have a structure that is vertically and adjacently stacked on the semiconductor substrate 100. The vertically adjacent local word lines LWL0, . . . LWL3 are insulated by an insulating layer (not shown). Local bit lines LBL0, . . . LBL3 may be disposed to cross the local word lines LWL0, . . . LWL3 vertically stacked on the semiconductor substrate 100. Also, each of the local word lines LWL0, . . . LWL3 may be line which is horizontal to the semiconductor substrate 100 and each of the local bit lines LBL0, . . . LBL3 may be line which is vertical to the semiconductor substrate 100. In the arrangement structure described above, a resistive memory material layer 110 is disposed between the local word lines LWL0, . . . LWL3 and the local bit lines LBL0, . . . LBL3. The resistive memory material layer 110 may include, for example, a colossal magnetro-resistive (CRM) material layer having a perovskite structure, a high temperature super conducting (HTSC) material layer or a transition metal oxide layer having two stable resistive states.

Although not illustrated in the drawings, the local word line selection unit 10 and the local bit line selection unit 20 connected to the memory blocks BLK0, . . . BLK2 respectively may be disposed between the local bit lines LBL0, . . . LBL3 and the semiconductor substrate 100.

Figure 6:
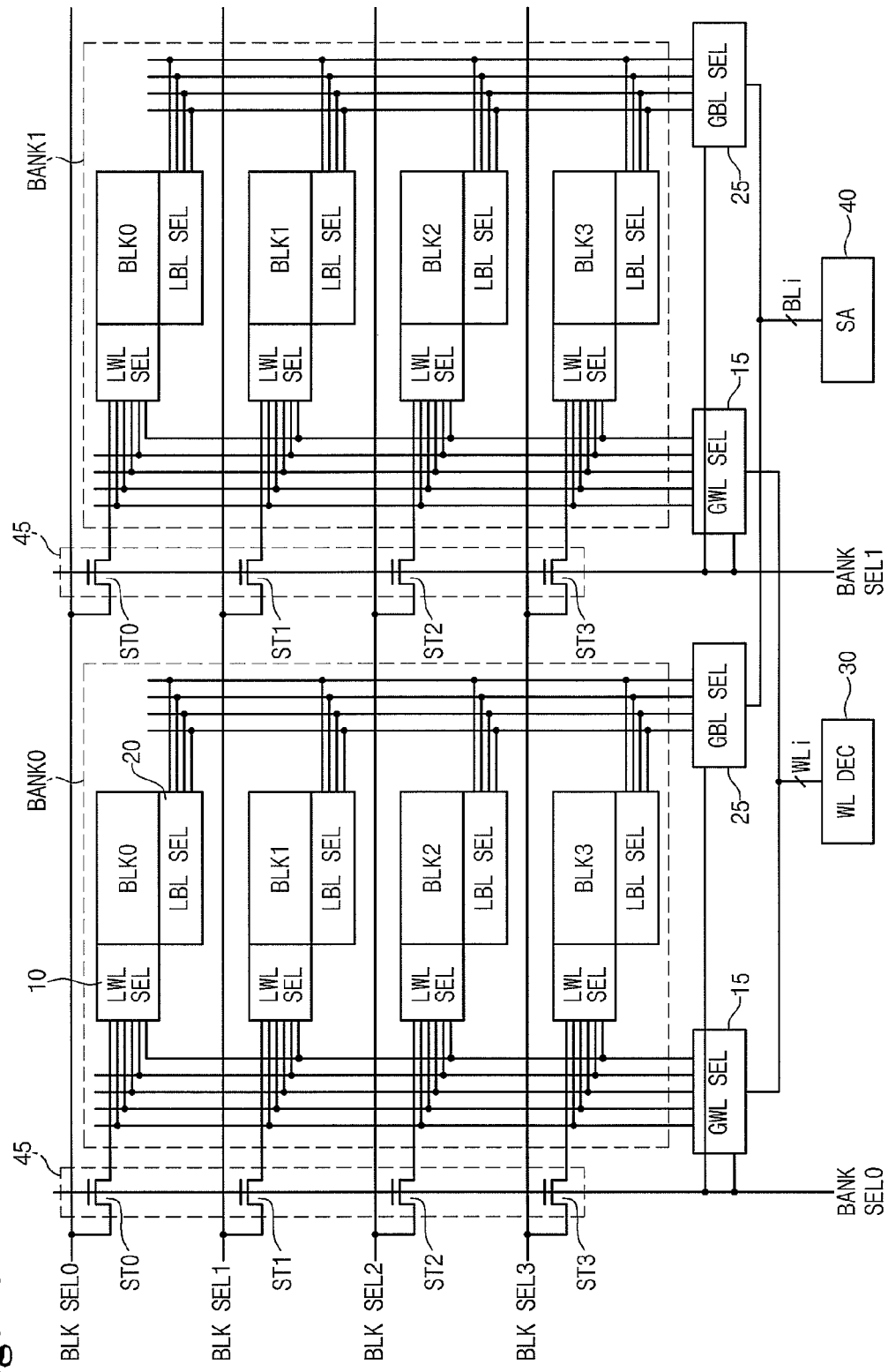
FIG. 6 is a circuit diagram of a nonvolatile memory device in accordance with an exemplary embodiment of the present inventive concept.
Figure 7:
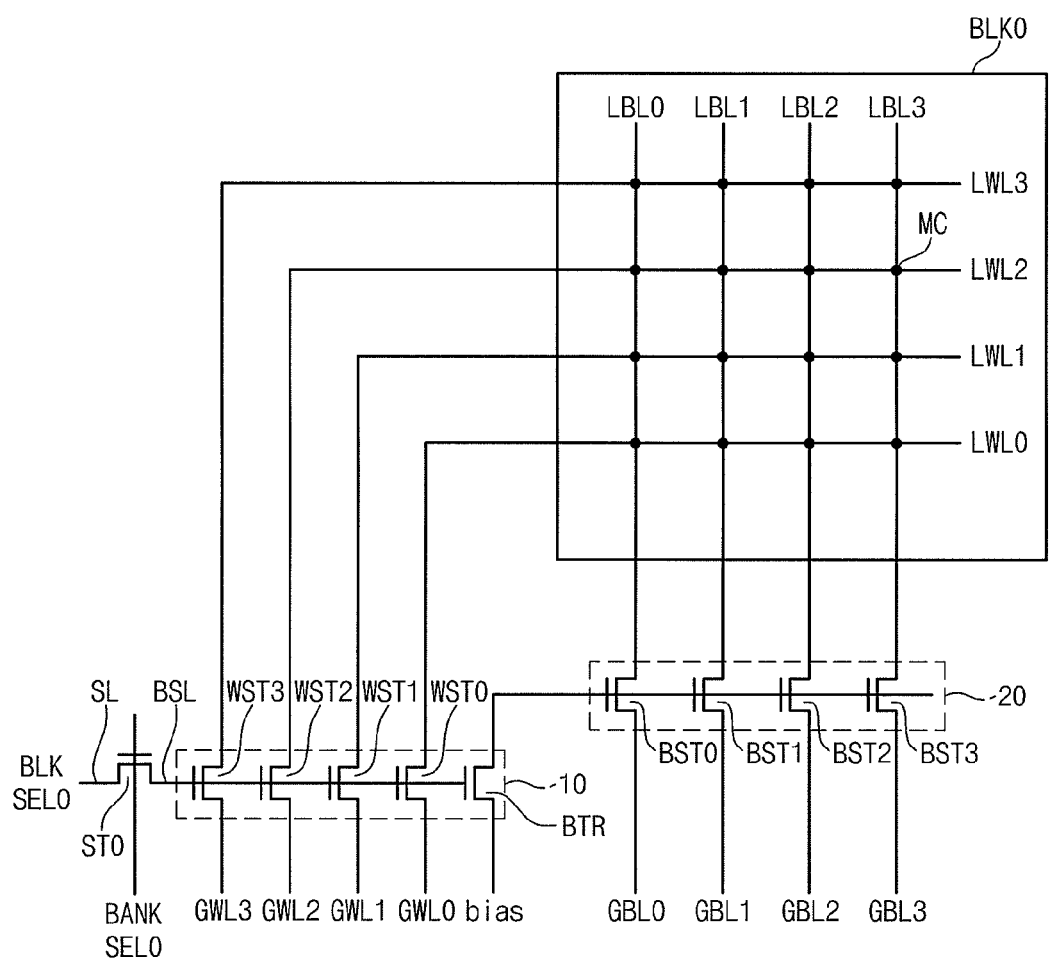
FIG. 7 is a circuit diagram of a memory block in a nonvolatile memory device in accordance with an exemplary embodiment of the present inventive concept.

FIG. 6 is a circuit diagram of a nonvolatile memory device in accordance with an exemplary embodiment of the present inventive concept. FIG. 7 is a circuit diagram of a memory block in a nonvolatile memory device in accordance with an exemplary embodiment of the present inventive concept.

Although the nonvolatile memory device in accordance with an exemplary embodiment in FIG. 6 illustrates only two memory banks, the number of the memory banks may become different according to a capacitor of a memory. FIG. 7 illustrates the local word line selection unit 10, the local bit line selection unit 20 and the block select switching circuit 45 that are connected to one representative memory block BLK0.

Referring to FIGS. 6 and 7, the nonvolatile memory device includes a plurality of memory banks BANK1, BANK2, a global word line selection unit 15, a global bit line selection unit 25, a block select switching circuit 45 and a bank select circuit (not illustrated). The plurality of memory banks BANK1, BANK2 can share the block select circuit 50 of FIG. 1, the word line decoder 30 and the sense amplifier 40. Each of the memory banks BANK1, BANK2 is connected to the block select switching circuit 45. Also, each of the memory banks BANK1, BANK2 may include a plurality of memory blocks BLK0, . . . BLK3 and the local word line selection unit 10 and the local bit line selection unit 20 corresponding to the plurality of memory blocks BLK0, . . . BLK3. In each of the memory banks BANK1, BANK2, a connection structure of the memory blocks BLK0, . . . BLK3, the local word line selection unit 10 and the local bit line selection unit 20 is substantially the same as depicted in FIG. 3. Also, memory cells MC may be three dimensionally disposed over the plurality of memory blocks BLK0, . . . BLK3.

The bank select circuit (not illustrated) generates bank select signals BANK SEL0, BANK SEL1 for selecting the memory banks BANK1, BANK2. The bank select signals BANK SEL0, BANK SEL1 are provided to the global word line selection unit 15, the global bit line selection unit 25 and the block select switching circuit 45 included in each of the memory banks BANK1, BANK2.

The global word line selection unit 15 selects the global word lines GWL0, . . . GWL3 in response to the bank select signals BANK SEL0, BANK SEL1 provided from the bank select circuit (not illustrated). The global word line selection unit 15 may include a plurality of global word line select transistors (not illustrated). Here, the global word line select transistors electrically connect the global word lines GWL0, . . . GWL3 of the memory bank BANK1, BANK2 and word lines WLi of the word line decoder 30 in response to the bank select signals BANK SEL0, BANK SEL1.

The global bit line selection unit 25 selects the global bit line GBL0, . . . GBL3 in response to the bank select signals BANK SEL0, BANK SEL1 provided from the bank select circuit. The global bit line selection unit 25 includes a plurality of global bit line select transistors (not illustrated). Here, the global bit line select transistors electrically connect the global bit lines GBL0, . . . GBL3 of the memory banks BANK1, BANK2 and bit lines BLi of the sense amplifier 40 in response to the bank select signals BANK SEL0, BANK SEL1.

The block select switching circuit 45 provides block select signals BLK SEL0, . . . BLK SEL3 to the memory banks BANK1, BANK2 in response to the bank select signals BANK SEL0, BANK SEL1 provided from the bank select circuit. The block select switching circuit 45 includes a plurality of block select transistors ST0, . . . ST3. The block select switching circuit 45 connects a select line SL of the block select circuit 50 of FIG. 1 and a block select line BLL of the local word line selection unit in response to the bank select signals BANK SEL0, BANK SEL1.

The block select signals BLK SEL0-BLK SEL3 provided from the block select circuit 50 of FIG. 1 selects one from among a plurality of memory blocks BLK0, . . . BLK3 in the selected memory bank BANK0.

In the nonvolatile memory device in accordance with an exemplary embodiment of the present inventive concept, one memory block may be selected by the bank select signal BANK SEL0, BANK SEL1 and the block select signals BLK0, . . . BLK3. That is, one memory cell among the three dimensionally arranged memory cells MC may be selected by decoding the word lines WL0, . . . WL3 of the word line decoder 30 and the bit lines BL0, . . . BL3 of the sense amplifier 40.

More specifically, the global word line selection unit 15, the global bit line selection unit 25 and the block select switching circuit 45 of the selected memory bank BANK0 are activated by the bank select signals BANK SEL0, BANK SEL1 generated from the bank select circuit. Thus, the global word lines GWL0, . . . GWL3 of the selected memory bank BANK0 are connected to the word lines WLi and the global bit lines GBL0, . . . GBL3 of the selected memory bank BANK0 are connected to the bit lines BLi. The block select signals BLK SEL0, . . . BLK SEL3 are transmitted to the memory blocks BLK0, . . . BLK3 of the selected memory bank BANK0. One memory block among the plurality of memory blocks BLK0, . . . BLK3 may be selected according to the block select signals BLK SEL0, . . . BLK SEL3. That is, the local word line selection unit 10 and the local bit line selection unit 20 of the selected memory block BLK0 are activated and thereby the global word lines GWL0, . . . GWL3 are connected to the local word lines LWL0, . . . LWL3 of the selected memory block BLK0 and the global bit lines GBL0, . . . GBL3 are connected to the local bit lines LBL0, . . . LBL3 of the selected memory block BLK0. Thus, a read operation and a write operation may be performed on the selected memory block BLK0.

Hereinafter, an operational method of a nonvolatile memory device in accordance with an exemplary embodiment of the present inventive concept is described. First, referring to FIG. 8, an operation of a memory cell (i.e., a resistive memory device) will be described.

Figure 8:
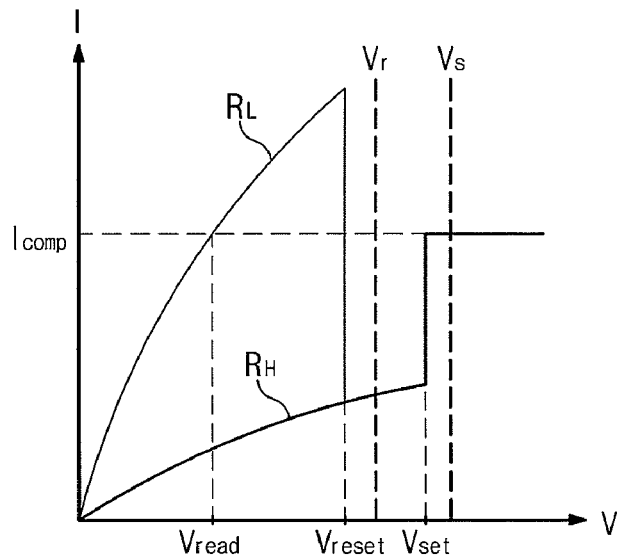
FIG. 8 is a current-voltage characteristic curve representing an operational characteristic of a resistive memory device of a nonvolatile memory device in accordance with an exemplary embodiment of the present inventive concept.

FIG. 8 is a current-voltage characteristic curve representing an operational characteristic of a resistive memory device of a nonvolatile memory device in accordance with an exemplary embodiment of the present inventive concept. In an exemplary embodiment of the present inventive concept, a unipolar resistive memory device, for example, requiring a voltage of the same polarity to switch a resistive state will be described. In FIG. 8, curve $R_L$ represents the case where the resistive memory device is a low resistive state and curve $R_H$ represents the case where the resistive memory device is a high state.

A resistive state of a resistive memory device may be reversibly changed by an electric pulse applied to both ends of material having two stable resistive states (a high resistive state and a low resistive state). Thus, voltages different from each other are applied to both ends of the resistive memory device to perform a write operation of the nonvolatile memory device to perform a switching operation between a set state (a state that data 1 is stored or an ON state) and a reset state (a state that data 0 is stored or an OFF state).

More specifically, when an initial resistive state of the resistive memory device is high (that is, a high resistive state), if gradually increasing a voltage applied to the resistive memory device from 0V, a current is gradually increased along the $R_H$ curve. If the applied voltage increases more than a specific voltage (a set voltage Vset), a current is abruptly increased and thereby the resistive memory device switches from a high resistive state (a reset state) to a low resistive state (a set state).

A maximum allowable current of the resistive memory device is limited when the set voltage Vset is applied to prevent the resistive memory device from being damaged due to a large current flowing through the resistive memory device while the set voltage Vset is applied to both ends of the resistive memory device. That is, a maximum allowable current compliance is applied to the resistive memory device.

By gradually decreasing an applied voltage of the resistive memory device after a resistive state of the resistive memory device switches to a set state, a current is gradually decreased and when an applied voltage is 0V, a current does not flow.

By gradually increasing an applied voltage to the resistive memory device switched to a set state, a current is gradually increased along the curve $R_L$. If a voltage applied to the resistive memory device of a set state increases more than a specific voltage (the reset voltage Vreset), a current is abruptly decreased and thereby the resistive memory device goes back to a high resistive state (the reset state) from a low resistive state (the set state). By gradually decreasing an applied voltage of the resistive memory device after the resistive memory device switches to a reset state, a current is gradually decreased.

A resistive state of the resistive memory device is uniformly maintained below a predetermined voltage. That is, in a high resistive state, if an applied voltage is less than the set voltage Vset, a current-voltage characteristic linearly changes along the curve $R_H$ and in a low resistive state, if an applied voltage is less than the reset voltage Vreset, a current-voltage characteristic linearly changes along the curve $R_L$. That is, in a predetermined voltage below the reset voltage Vreset, a current flowing through the resistive memory device can indicate a resistive state of the resistive memory device. In other words, in a read voltage Vread below the reset voltage Vreset, data stored in the resistive memory device can be read according to a current flowing through the resistive memory device.

In the nonvolatile memory device in accordance with exemplary embodiments of the present inventive concept, a data write and a read operation of memory cells of the selected memory block will now be described. In an operational method of the nonvolatile memory device in accordance with an exemplary embodiment of the present inventive concept, the memory cell array two dimensionally arranged in one memory block can read and write data by a page unit. The page unit represents memory cells simultaneously selected when one word line is selected.

In FIGS. 9 through 12, word lines WL0, . . . WL3 may be local word lines LWL0, . . . LWL3 of the nonvolatile memory device in accordance with an exemplary embodiment of the present inventive concept and bit lines BL0, . . . BL3 may be local bit lines BWL0, . . . BWL3 of the nonvolatile memory device in accordance with an exemplary embodiment of the present inventive concept.

In a write operation of the nonvolatile memory device in accordance with exemplary embodiments of the present inventive concept, a set voltage Vs for switching a memory cell to a set state may be greater than the set voltage of the variable resistive memory device illustrated in FIG. 8 by a predetermined value and a current limitation is applied. Also, a reset voltage Vr for switching a memory cell to a reset state may be greater than the reset voltage of the variable resistive memory device illustrated in FIG. 8 by a predetermined value.

Figure 9:
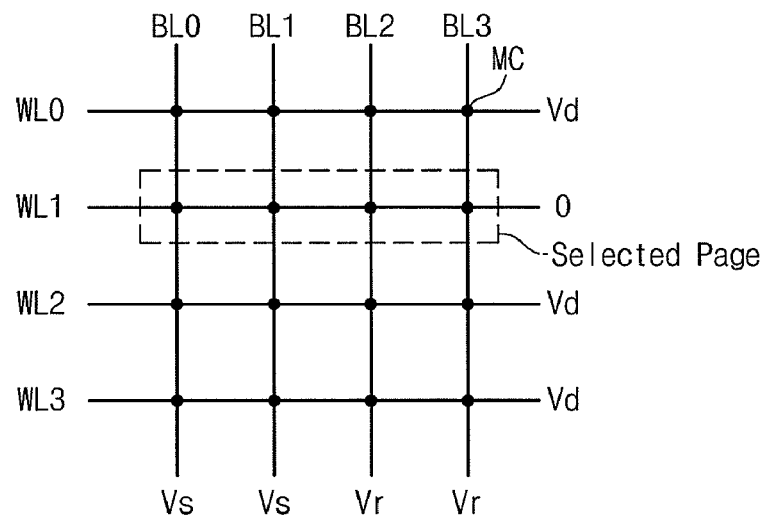
FIG. 9 is a schematic diagram representing a bias condition for performing a write operation of a nonvolatile memory device in accordance with an exemplary embodiment of the present inventive concept.

FIG. 9 is a view representing a bias condition for performing a write operation of a nonvolatile memory device in accordance with an exemplary embodiment of the present inventive concept.

Referring to FIG. 9, 0V (GND) is applied to the selected word line WL1, and the set voltage Vs or the reset voltage Vreset is selectively applied to bit lines BL0, . . . BL3 according to data to be written in the memory cells MC so as to write data in memory cells MC connected to the selected word line WL1. That is, the set voltage Vs is applied to the bit lines BL0, BL1 connected to the memory cells in which data "1" is to be stored and the reset voltage Vr is applied to the bit lines BL2, BL3 connected to the memory cells in which data "0" is to be stored.

A dummy voltage Vd is applied to unselected word lines WL0, WL2, WL3 so that the set voltage Vs or the reset voltage Vr is not applied to the memory cells MC disposed on crosspoints at which the unselected word lines WL0, WL2, WL3 and the bit lines BL0, . . . BL3 cross one another. The dummy voltage Vd has a voltage similar to the set voltage Vs and the reset voltage Vr so that resistive states of the unselected memory cells MC are not switched. Ideally, voltage differences between the unselected memory cells MC have to satisfy a condition of $|Vs-Vd|=|Vr-Vd|$. However, since the set voltage is greater than the reset voltage due to the operational characteristic of the resistive memory device, the dummy voltage has to satisfy a condition of $|Vs-Vd|<Vreset$ and $|Vr-Vd|<Vreset$. Thus, the dummy voltage Vd may have a predetermined voltage value which is greater than the reset voltage Vreset and smaller than the set voltage Vset.

In a write method of the nonvolatile memory device in accordance with an exemplary embodiment of the present inventive concept, the selected memory cells MC can write data according to the voltage applied to the selected memory cells MC regardless of an initial resistive state. More specifically, if a reset voltage is applied to a memory cell MC of which an initial resistive state is a set state, a resistive state of the memory cell MC switches to a reset state and if a set voltage is applied to a memory cell MC of which an initial resistive state is a set state, a resistive state of the memory cell MC switches to a reset state, and then switches to a set state. If a reset voltage is applied to a memory cell MC of which an initial resistive state is a reset state, a resistive state of the memory cell MC maintains a reset state and if a set voltage is applied to a memory cell MC of which an initial resistive state is a set state, a resistive state of the memory cell MC switches to a set state. That is, a write operation may be simultaneously performed on the memory cells MC regardless of initial resistive states of the selected memory cells MC.

Figure 10A:
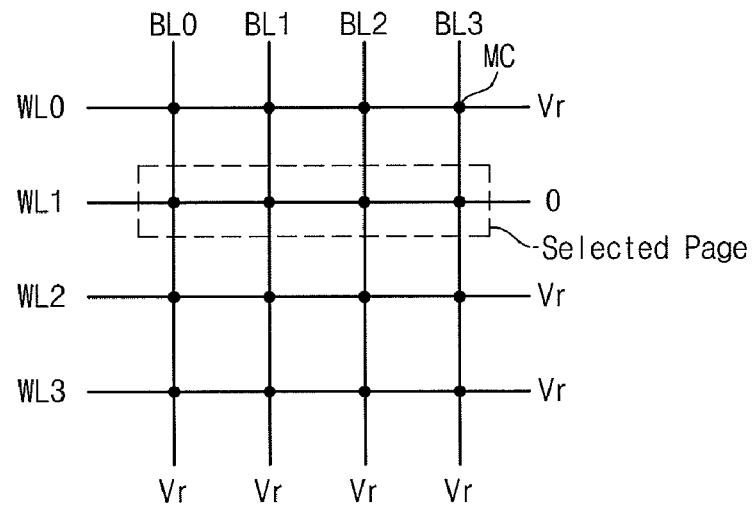
FIGS. 10A and 10B are schematic diagrams representing a bias condition for performing a write operation of a nonvolatile memory device in accordance with an exemplary embodiment of the present inventive concept.
Figure 10B:
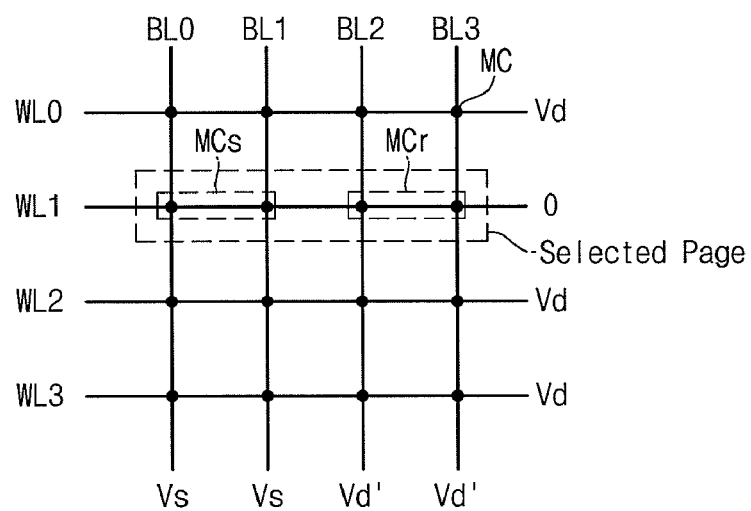

FIGS. 10A and 10B are views representing a bias condition for performing a write operation of a nonvolatile memory device in accordance with an exemplary embodiment of the present inventive concept.

A write operation of the nonvolatile memory device in accordance with an exemplary embodiment of the present inventive concept includes a step of switching all of the memory cells of the selected page to a reset state and a step of selectively switching the memory cells of the selected page to a set state.

Referring to FIG. 10A, all of the memory cells MC of the selected page are switched to a reset state. That is, data "0" may be written in all of the memory cells MC of the selected page. More specifically, 0V (GND) is applied to the selected word line WL1 and a reset voltage Vr is applied to bit lines BL0, . . . BL3. Accordingly, the reset voltage is applied to both ends of the memory cells MC of the selected page and thereby the memory cells MC may be switched to the reset state. That is, data "0" may be stored in the memory cells MC of the selected page. The reset voltage Vr is applied to the unselected word lines WL0, WL2, WL3. Thus, a current flow does not occur in memory cells MC of cross-points at which the unselected word lines WL0, WL2, WL3 and the bit lines BL0, . . . BL3 cross one another.

Referring to FIG. 10B, the memory cells of the selected page having a reset state are switched to a set state. That is, 0V is applied to the selected word line WL1 and a set voltage Vs is applied to the bit lines BL0, BL1 connected to the memory cells MC in which data "1" is to be written among the memory cells of the selected page. At this time, a current limitation is applied to the set voltage Vs. Thus, data "0" or data "1" may be written in the memory cells of the selected page. In the selected page, memory cells MCr which are not switched to a set state have to maintain a reset state. Thus, in the selected page, a maintaining voltage Vd' is applied to the unselected bit lines BL2, BL3 so that a resistive state of the memory cells MCr which are not switched to a set state is not switched. Also, a dummy voltage Vd is applied to the unselected word lines WL0, WL2, WL3 so that a resistive state of the unselected word lines WL0, WL2, WL3 is not switched.

The dummy voltage Vd and the maintaining voltage Vd' applied to both ends of the memory cells of which a resistive state is not switched have to satisfy the following condition. The dummy voltage Vd have to satisfy a condition of Vs−Vd<Vreset so that memory cells connected to the unselected word lines WL0, WL2, WL3 and to the bit lines BL0, BL1 to which the set voltage is applied are not switched. Also, the maintaining voltage Vd' have to satisfy a condition of Vd−Vd'<Vreset so that memory cells MC connected to the unselected word lines WL0, WL2, WL3 and the bit lines BL2, BL3 to which the maintaining voltage Vd') is applied are not switched. The maintaining voltage Vd' have to be smaller than the set voltage Vs so that memory cells (i.e., memory cells MCr) of the reset state connected to the selected word line WL1 and the bit lines BL2, BL3 to which the maintaining voltage Vd' is applied are not switched to the set state. Thus, the dummy voltage Vd has a predetermined value that is greater than the reset voltage Vr and smaller than the set voltage Vs. The maintaining voltage Vd' has a predetermined value that is greater than the dummy voltage Vd and the set voltage Vs.

In the mean time, unlike the write operation of an exemplary embodiment of the present inventive concept, after all of the memory cells are switched to a set state, the memory cells of the selected page are switched to a reset state to perform a write operation. Those described above are illustrated in FIGS. 11A and 11B.

Figure 11A:
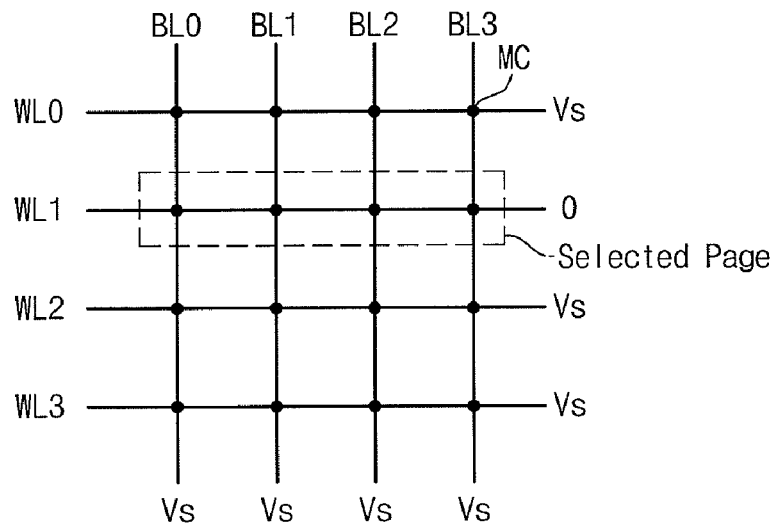
FIGS. 11A and 11B are schematic diagrams representing a bias condition for performing a write operation of a nonvolatile memory device in accordance with still an exemplary embodiment of the present inventive concept.
Figure 11B:
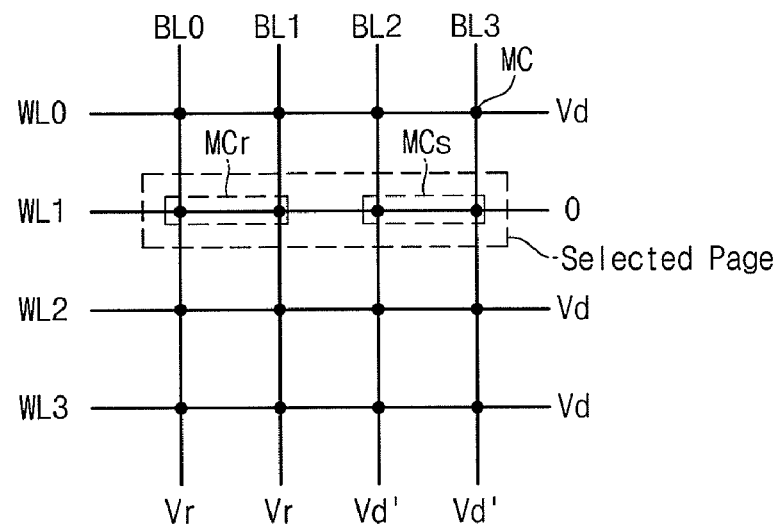

FIGS. 11A and 11B are views representing a bias condition for performing a write operation of a nonvolatile memory device in accordance with an exemplary embodiment of the present inventive concept.

Referring to FIG. 11A, 0V is applied to the selected word line WL1 and the set voltage Vs to which a current limitation is applied is applied to all of the bit lines BL0, . . . BL3 to switch all of the memory cells MC of the selected page to a set state. Also, a dummy voltage Vd is applied to the unselected word lines WL0, WL2, WL3.

Referring to FIG. 11B, the memory cells of the selected page having a set state are selectively switched to a reset state. That is, a reset voltage Vr is applied to bit lines BL0, BL1 connected to memory cells MCr for switching to the reset state and a maintaining voltage Vd' is applied to bit lines BL2, BL3 connected to memory cells MC which are maintained at a set state. Also, a dummy voltage Vd may be applied to unselected word lines WL0, WL2, WL3 so that a resistive state of a memory cell is not switched. In an exemplary embodiment of the present inventive concept, a condition of a voltage applied to word lines WL0, . . . WL3 and bit lines BL0, . . . BL3 may be identical to that described with reference to FIGS. 10A and 10B.

Figure 12:
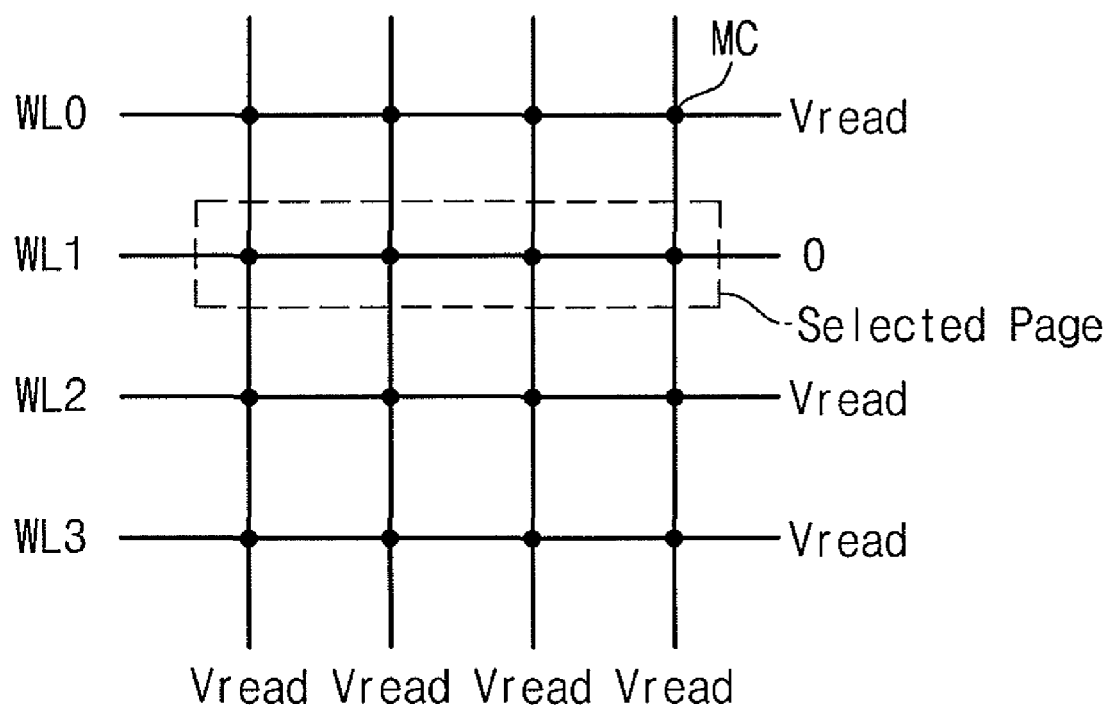
FIG. 12 is a schematic diagram representing a bias condition for performing a write operation of a nonvolatile memory device in accordance with an exemplary embodiment of the present inventive concept.

FIG. 12 is a view representing a bias condition for performing a write operation of a nonvolatile memory device in accordance with an exemplary embodiment of the present inventive concept.

Referring to FIG. 12, data stored in memory cells of the selected page can be read by applying 0V (GND) to the selected word line WL1 and applying a read voltage Vread to all of the bit lines BL0, . . . BL3. That is, a voltage difference less than a reset voltage is applied to both ends of the memory cells of selected page and a current flowing through the memory cells MC is sensed. In other words, data of a memory cell can be read by measuring a voltage level of each bit line changed by a current which flows from bit lines BL0, . . . BL3 of a specific voltage level to a word line WL1. The read voltage Vread) is applied to unselected word lines WL0, WL2, WL3 to prevent a current from flowing through memory cells MC of the unselected page.

Figure 13:
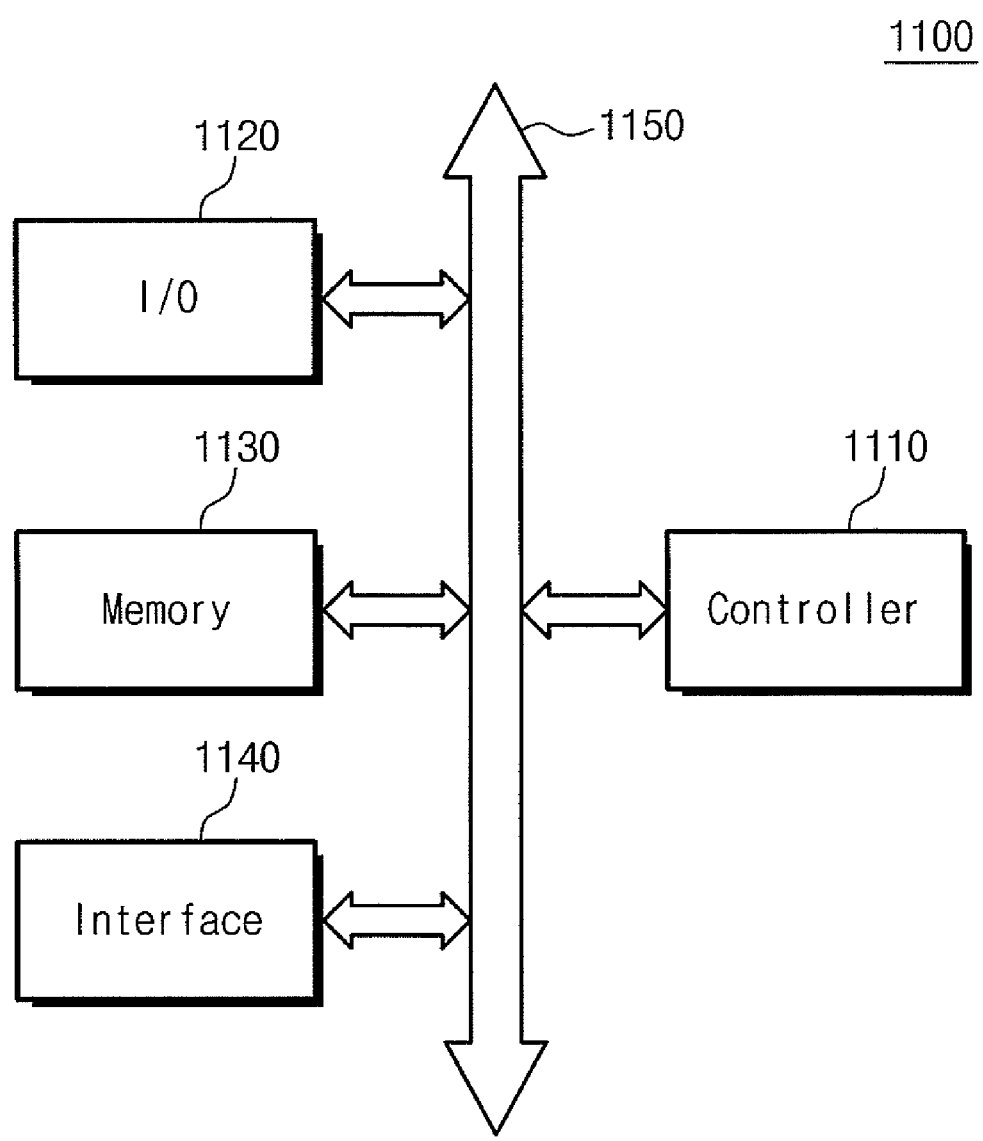
FIG. 13 is a block diagram illustrating a memory system including a nonvolatile memory device in accordance with exemplary embodiments of the present inventive concept.

FIG. 13 is a block diagram illustrating an example of a memory system including a nonvolatile memory device in accordance with exemplary embodiments of the present inventive concept.

Referring to FIG. 3, a memory system 1100 can be applied to PDA, a portable computer, a web tablet, a wireless phone, a mobile phone, a digital music player, a memory card or all the devices which can transmit and/or receive data in a wireless environment.

The memory system 1100 includes a controller 1110, an input/output device 1120 such as a keypad, a keyboard and a displayer, a memory 1130, an interface 1140 and a bus 1150. The memory 1130 and the interface 1140 communicate with each other through the bus 1150.

The controller 1100 includes at least one microprocessor, a digital signal processor, a microcontroller or other processors similar to the microprocessor, the digital signal processor and the microcontroller. The memory 1130 may be used to store a command executed by the controller 1110. The input/output device 1120 may receive data or a signal from the outside of the system 1100 or may output data or a signal to the outside of the system 1100. For example, the input/output device 1120 may include a keyboard, a keypad or a display device.

The memory 1130 includes a nonvolatile memory device in accordance with at least one of the exemplary embodiments of the present inventive concept. The memory 1130 may further include other kinds of memories, a volatile memory which can randomly and arbitrarily access and various kinds of memories.

The interface 1140 transmits data to a communication network or receives data from a communication network.

Figure 14:
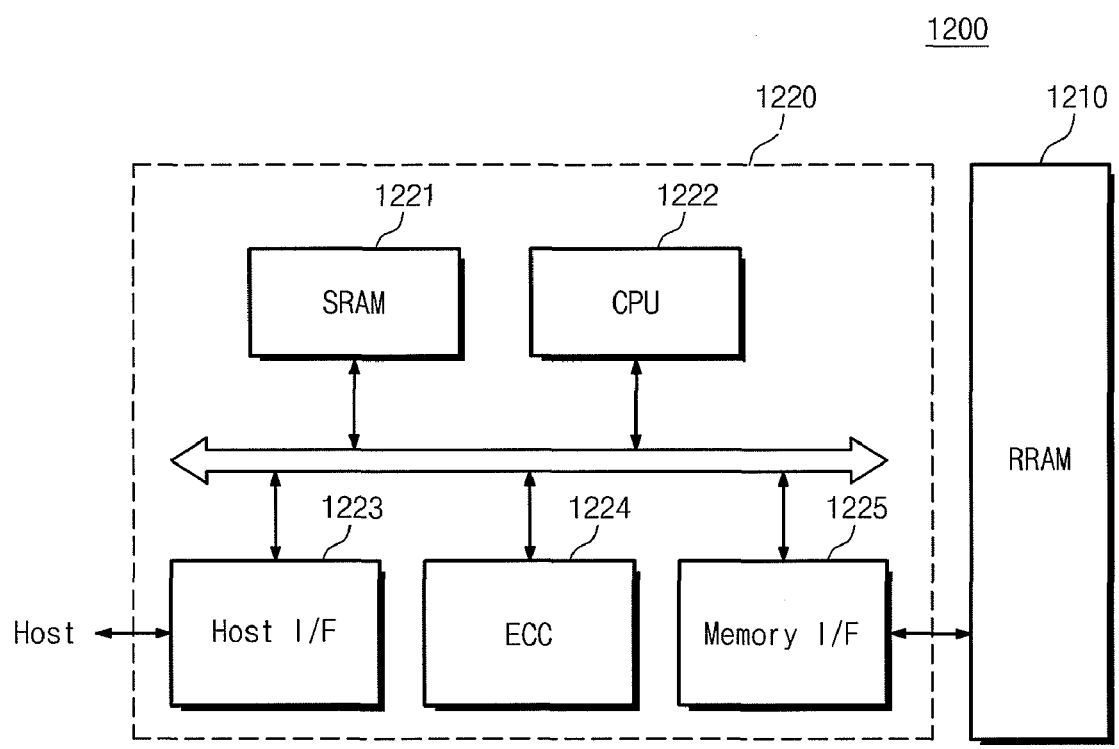
FIG. 14 is a block diagram illustrating a memory card including a nonvolatile memory device in accordance with an exemplary embodiment of the present inventive concept.

FIG. 14 is a block diagram illustrating an example of a memory card including a nonvolatile memory device in accordance with an exemplary embodiment of the present inventive concept.

Referring to FIG. 14, a memory card 1200 for supporting storage capability of huge amounts of data is fitted with an RRAM 1210. The memory card 1200 includes a memory controller 1220 controlling every data exchange between a host and an RRAM 1210.

A SRAM 1221 is used as an operational memory of a processing unit 1222. A host interface 1223 includes a data exchange protocol connected to the memory card. An error correction code 1224 detects and corrects an error included in data read from a multi bit flash memory device 1210. The memory interface 1225 interfaces with the flash memory device 1210 of the present inventive concept. The processing unit 1222 performs control operations for data exchange of the memory controller 1220. Although not illustrated in the drawings, the memory card 1200 in accordance with the present inventive concept may further include ROM (not illustrated) storing code data for interfacing with the host.

Figure 15:
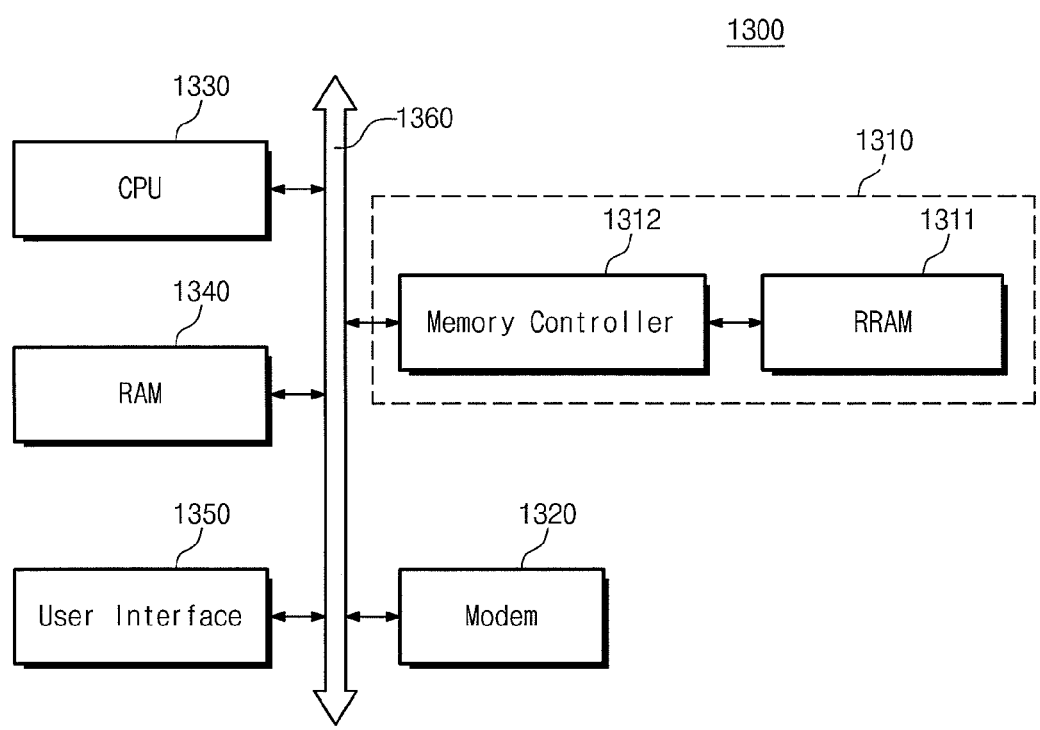
FIG. 15 is a block diagram illustrating a data processing system fitted with a nonvolatile memory device in accordance with the present inventive concept.

FIG. 15 is a block diagram illustrating an example of a data processing system fitted with a nonvolatile memory device in accordance with the present inventive concept.

Referring to FIG. 15, an RRAM 1310 of the present inventive concept is built in a data processing system such as a mobile device or a desktop computer. The data processing system 1300 in accordance with the present inventive concept includes a RRAM 1310 and a modem 1320, a central processing unit 1330, a RAM 1340 and a user interface 1350 that are electrically connected to a system bus 1360. The RRAM 1310 may be formed to be substantially identical to the memory system described above. Data processed by the central processing unit 1330 or data inputted from the outside may be stored in the RRAM 1310. Here, the RRAM 1310 may be made by a solid state disk SSD) and in this case, the data processing system 1300 can stably store huge amounts of data. Although not illustrated in the drawings, the data processing system 1300 may further include an application chipset, a camera image processor, an input/output device or the like.

The RRAM or the memory system in accordance with the present inventive concept may be mounted by various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

According to a nonvolatile memory device of the present inventive device, memory cells of cross-points three dimensionally arranged can be driven by a memory block unit using one word line decoder and one sense amplifier. Thus, a leakage current flowing through unselected memory cells can be reduced and the nonvolatile memory device can be highly integrated.

The above-disclosed subject matter is to be considered illustrative, and not restrictive, and the appended claims are intended to cover all such modifications, enhancements, and other exemplary embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device comprising:
    a plurality of memory blocks;
    a block selection circuit that generates a block select signal for selecting at least one of the memory blocks;
    a plurality of local word line selection units that connect global word lines connected to a word line decoder and local word lines in response to the block select signal, the plurality of local word line selection units being connected to each memory block; and
    a plurality of local bit line selection units that connect global bit lines connected to a sense amplifier and local bit lines in response to the block select signal, the plurality of local bit line selection units being connected to each memory block,
    wherein each memory block comprises:
    the local word lines which extend in a first direction on a second plane perpendicular to a first plane and are stacked in a second direction perpendicular to the first direction;
    the local bit lines which extend in the second direction to cross the local word lines; and
    memory cells formed at cross-points where the local word lines and the local bit lines cross one another.

2. The nonvolatile memory device of claim 1, wherein the global word lines are connected to the local word line selection unit in common.

3. The nonvolatile memory device of claim 1, wherein the global bit lines are connected to the local bit line selection unit in common.

4. The nonvolatile memory device of claim 1, wherein the local word line selection unit comprises:
    a plurality of word line select transistors controlled by the block select signal; and
    a bias transistor that provides a bias signal that controls the bit line selection unit to the bit line selection unit in response to the block select signal.

5. The nonvolatile memory device of claim 4, wherein the local bit line selection unit comprises a plurality of bit line select transistors controlled by the bias signal.

6. The nonvolatile memory device of claim 1, further comprising:
    a plurality of memory banks comprising the plurality of memory blocks, the local word line selection units and the local bit line selection units; and
    a bank select circuit that generates a memory bank select signal that selects at least one of the memory banks.

7. The nonvolatile memory device of claim 6, further comprising a block select switching circuit connected to each of the memory banks and that transfers the block select signal to a selected memory bank in response to the memory bank select signal.

8. The nonvolatile memory device of claim 7, wherein the block select switching circuit comprises a plurality of block select transistors that connects the block select circuit and the local word line selection units in response to the memory bank select signal.

9. The nonvolatile memory device of claim 1, wherein the memory cell comprises at least one of a resistive memory device, or a resistive memory device and a switching device.

10. The nonvolatile memory device of claim 1, wherein the memory cell comprises a phase change material, a transition metal oxide or a magnetic material.

11. A resistive random access memory array apparatus comprising:
- a plurality of memory blocks stacked in a first direction, each memory block having an array of memory cells located in a plane of the memory block, the plane being substantially perpendicular to the first direction, each memory cell being a resistive memory cell located at an intersection of a local word line and a local bit line in the plane;
- a local word line selection unit configured to connect the local word line of the memory block to a global word line;
- a local bit line selection unit configured to connect the local bit line of the memory block to a global bit line; and
- a block select circuit that generates a block select signal for selecting a memory block,
- wherein in response to the block select signal, a selected local word line selection unit connects a selected memory cell to a global word line and a selected local bit line selection unit connects the selected memory cell to a global bit line.

12. The resistive random access memory array apparatus of claim 11, wherein the resistive memory cell comprises a resistive memory material layer disposed between the local word line and the local bit line.

13. The resistive random access memory array apparatus of claim 12, where the resistive memory material layer is from the group consisting of a colossal magnetro-resistive (CRM) material layer having a perovskite structure, a high temperature super conducting (HTSC) material layer, and or a transition metal oxide layer having two stable resistive states.

14. The resistive random access memory array apparatus of claim 11,
- wherein a first plurality of the memory blocks are in a first memory bank and a second plurality of memory blocks are in a second bank, and
- further comprising a bank select circuit that generates a memory bank select signal that selects at least one of the first memory bank or the second memory bank.

15. The resistive random access memory array apparatus of claim 11, wherein the array of memory cells are accessible to a memory controller of a memory card, the memory controller controlling data exchange between a host and the array of memory cells.

16. The resistive random access memory array apparatus of claim 11, wherein the array of memory cells are accessible to a memory controller coupled to a bus of a data processing system having a central processing unit that stores processed data in the array of memory cells.

17. The resistive random access memory array apparatus of claim 11, wherein the array of memory cells are accessible to a memory controller coupled to a bus of a memory system, the memory controller configured to execute commands stored in the array of memory cells.

* * * * *